United States Patent [19]

Sheppard et al.

[11] Patent Number: 5,319,519
[45] Date of Patent: Jun. 7, 1994

[54] HOUSING WITH LATCH AND EJECTION MECHANISM AIR PORTABLE HARD DISK DRIVE

[75] Inventors: Dan C. Sheppard, Vista; Lynn H. Wilson, Santa Cruz; Douglas R. Domel, Chatsworth, all of Calif.

[73] Assignee: Summatec Computer Corporation, Vista, Calif.

[21] Appl. No.: 984,177

[22] Filed: Nov. 20, 1992

[51] Int. Cl.⁵ .................... H05K 7/12; H05K 7/14; G06F 1/16
[52] U.S. Cl. ................................. 361/685; 361/726; 312/319.1
[58] Field of Search .................. 360/97.01, 98.01, 137; 364/708.1; 361/680–687, 724–727, 730, 732, 754, 759, 798, 801; 312/9.57, 319.1, 334.7; 439/76, 152, 159, 160, 374, 377, 638, 928

[56] References Cited

U.S. PATENT DOCUMENTS 4,941,841  7/1990  Darden et al. .................. 361/685
5,140,478  8/1992  Yoshida .......................... 360/97.01

OTHER PUBLICATIONS

Disctec Removable Hard Drives brochure "PC Computing Magazine" Oct. or Nov. 1992 925 S. Semoran Blvd. Ste. 114, Winter Park, Fla. 32792.
Vision Logic Advertisement 283 E. Brokaw Rd., San Jose, Calif. 95112 (408) 437-1000, Nov. 20, 1992 or earlier.

Primary Examiner—Leo P. Picard
Assistant Examiner—Michael W. Phillips
Attorney, Agent, or Firm—John L. Rogitz

[57] ABSTRACT

An apparatus for holding a portable hard disk drive in a desk-top personal computer (PC) has a housing that fits into the 3.5" form-factor cavity which is formed in most IBM ®-compatible PCs. The portable hard disk drive is disposed in a protective sleeve, and the sleeve with disk drive can be manually advanced into the housing to electrically engage the PC with the portable hard disk drive. An ejector mechanism is provided in the housing for manually ejecting the disk drive from the PC upon completion of data transfer between the disk drive and PC. The ejector mechanism includes a latch mechanism movable from a latched configuration, wherein the disk drive is held in electrical contact with the PC, and an unlatched configuration, wherein the disk drive can be ejected from the housing.

15 Claims, 5 Drawing Sheets

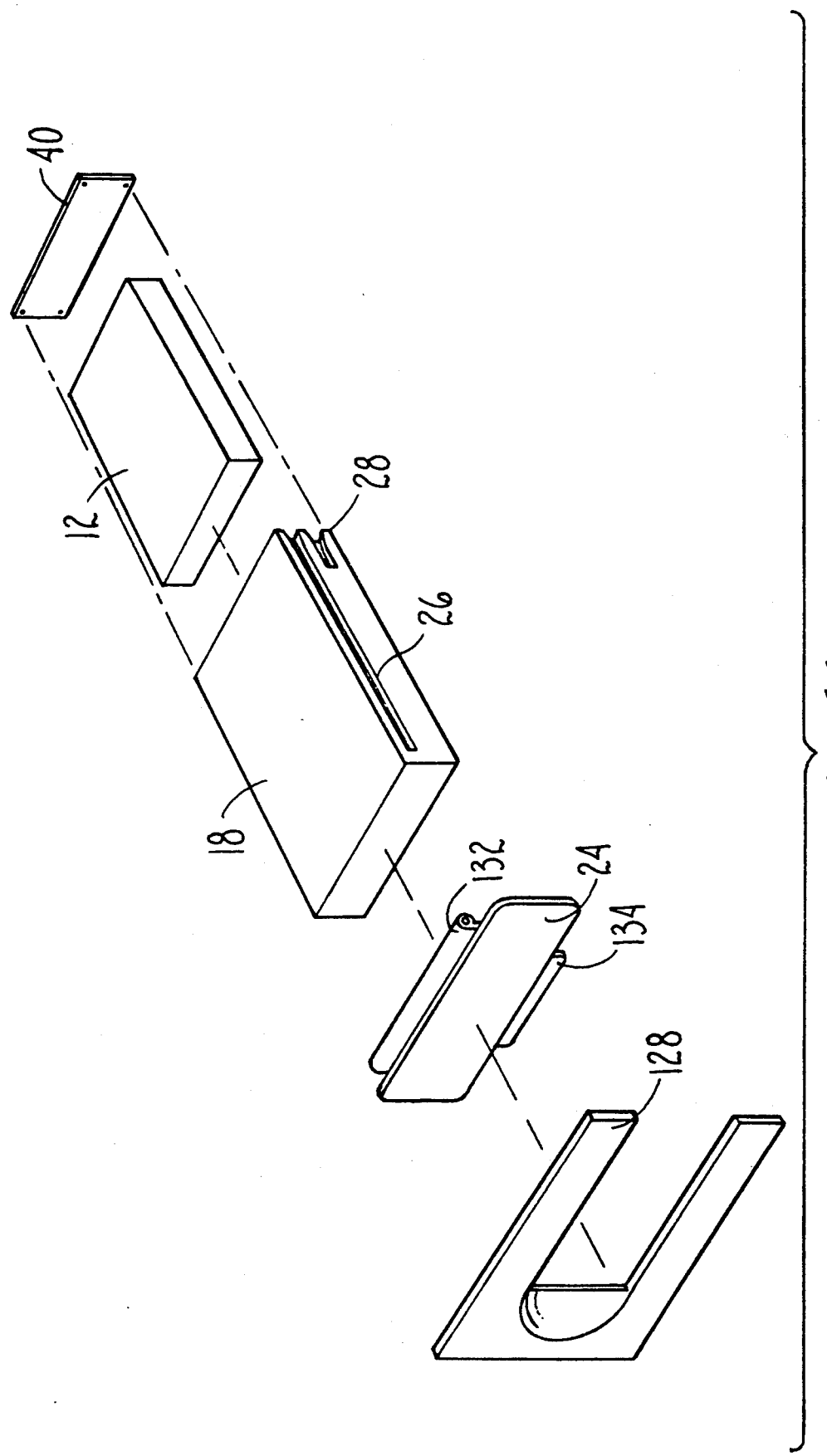

HOUSING WITH LATCH AND EJECTION MECHANISM AIR PORTABLE HARD DISK DRIVE

FIELD OF THE INVENTION

The present invention relates generally to computer memory apparatus, and more particularly to computer hard disk drives for personal computers (PCs).

BACKGROUND

Computer data in desk-top personal computers (PCs) is ordinarily stored on one of two generic types of direct access memory media, i.e., memory media which can be accessed when the user is on-line with the PC, and these two types of direct access memory media are broadly know as "disks" and "drives". The first type of direct access memory media is familiarly referred to as a "hard disk drive". A hard disk drive may be internal, i.e., it may be mounted within the PC, or external, i.e., it may be located next to the PC, but in either case, hard disk drives require electrical connections to the PC that can be cumbersome and time-consuming to make.

In contrast, a unit of the second type of direct access memory media, familiarly referred to as a "floppy disk", is manually inserted into a portion of the computer familiarly referred to as a floppy disk drive, and a floppy disk can be easily and quickly ejected from the floppy disk drive after data transfer. Thus, a floppy disk can be ejected, i.e., manually urged outwardly from a PC by pushing a button, without requiring that "hard" electrical contacts be unmade. On the other hand, a hard disk drive currently cannot be ejected from a desk-top PC, but must be disconnected from electrical connections in the PC and then removed. Hard disk drives, however, can store much more data than can floppy disks.

Modern PCs typically permit the use of both kinds of memory media, to afford the user of the PC the advantages associated with each. More specifically, as stated above, hard disk drives, which are ordinarily intended to be permanently connected to their respective PCs, have a large data storage capacity. In contrast, floppy disks have much lower data storage capability as compared to hard disk drives, but can easily be ejected from the computer when it is necessary to store data, e.g., confidential military or economic data, apart from the computer, or to transport the data computer-to-computer when a network is not available.

While this arrangement of data storage is useful, it has certain drawbacks. For example, when sensitive military or economic data is to be transferred from the permanent hard disk drive of a PC to a floppy disk for secure storage of the data, the only thing ordinarily "deleted" from the PC hard disk drive after data transfer is the name of the file that contains the data. The data, however, while inaccessible using most software, remains on the hard disk drive, and can be retrieved using specialized software. Thus, once confidential data has been stored on a permanently mounted hard disk drive, both the hard disk drive and it's associated PC must be treated as classified equipage. Understandably, this increases security costs and limits the access of non-cleared users to the PC.

Further, because of their relatively limited data storage capability, floppy disks cannot be used to store large amounts of data. Thus, if a large amount of data is to be transferred from the hard disk drive of a computer, more than a single floppy disk may be required. This increases expenses, tends to be labor-intensive, and requires excessive storage space.

Consequently, when large amounts of data are to be physically moved from a non-secure location to a comparatively secure area for data analysis, the data is ordinarily stored on a hard disk drive which is subsequently disconnected from the so-called host computer and then transported to the secure area. For example, surveillance aircraft tend to collect a large amount of data, and the collected data is stored in relatively bulky hard disk drives that have large data storage capacities. After mission completion, the disk drives are electrically disconnected from their host computers, which as stated above can be cumbersome and time consuming, and then removed from the craft after the mission for data analysis. Furthermore, many large hard disk drives unfortunately are heavy. This is a disadvantage in most computer applications and particularly in applications requiring airborne computer operation, wherein it is generally crucial to minimize the weight and volume of articles that are to be carried onboard the aircraft.

The above discussion focussed on but one application wherein data portability is desirable, but the need for data transfer is acute in a wide variety of other applications requiring data transfer between computers. Indeed, regardless of the particular application, a growing need exists to transfer large amounts of data between pairs of the ubiquitous desk-top personal computer. For example, a person who is located at a site remote from his desk-top PC (and its associated hard disk drive on which the person's files and software are stored) may require access to some or all of the data base (i.e., files and software) that is stored on the hard disk drive. When networks or network software are unavailable, the person must take his data base with him. He can do this by disconnecting his hard disk drive from his PC, transporting his hard disk drive with him, and then reconnecting the disk drive to a computer located at the remote site. Alternatively, the person can up-load his data base to a large number of floppy disks one at a time, transport the floppy disks to the remote site, and then down-load the data base from the floppy disks one at a time onto a computer located at the remote site. Unfortunately, both procedures are cumbersome and time-consuming.

In light of the above discussion, the present invention recognizes a need to provide the portability advantages inherent in floppy disks, without sacrificing the data storage capacity of hard disk drives.

Accordingly, it is an object of the present invention to provide an apparatus that can be associated with a desk-top personal computer and which can hold a portable hard computer disk drive in operable engagement with the computer. Another object of the present invention is to provide an apparatus for manually inserting and ejecting a portable hard disk drive into a desk-top personal computer. Yet another object of the present invention is to provide a portable hard disk drive housing for a desk-top personal computer which is easy to use and cost-effective to manufacture.

SUMMARY OF THE INVENTION

An apparatus for releasably holding a hard computer disk drive that has an electronic memory medium includes a parallelepiped-shaped housing. To fit snugly within a standard disk drive holder cavity in a desk-top personal computer, the housing has a length of about six inches (6"), a width of about four inches (4"), and a depth of about one and five-eighths inches (1.625").

In accordance with the present invention, the housing has an opening for receiving the hard computer disk drive therein. A plurality of electrical contacts are mounted, preferably generally opposite the opening, for engaging electrical contacts in the personal computer to establish a pathway for electrical communication between the personal computer and the memory medium in the hard disk drive.

Additionally, a key element is attached to the housing for guiding the hard disk drive into electrical contact with the electrical contacts of the housing. Preferably, the key element includes left and right guide rails opposed to each other relative to the housing, with each guide rail extending from near the opening of the housing to near the electrical contacts of the housing.

Further, an ejector mechanism is operably engaged with the housing for ejecting the hard disk drive from the housing. In the presently preferred embodiment, the ejector mechanism includes a latch mechanism that is movably connected to at least one of the guide rails. As intended by the present invention, a sleeve is positioned in a surrounding relationship to the disk drive, and the sleeve is formed with a guide channel for engaging the key element and a latch groove for engaging the latch mechanism.

In the preferred embodiment, the latch mechanism has a latched configuration, wherein the latch mechanism engages the sleeve to hold the disk drive against the electrical contacts of the housing, and an unlatched configuration, wherein the disk drive with sleeve can be manually inserted into and removed from the housing. The latch mechanism is biased to the latched configuration, and a push rod is slidably engaged with one of the guide rails and is connected to the latch mechanism for moving the latch mechanism to the unlatched configuration.

The latch mechanism includes a right latch rotatably connected to the right rail and a left latch rotatably connected to the left rail. Each latch has a latch arm which extends toward the opening of the housing, with each latch arm being ratchetably engageable with the hard disk drive sleeve. A spring interconnects the latches for biasing the latch mechanism to the latched configuration.

In another aspect of the present invention, an apparatus is provided which is operably engageable with a disk drive cavity of a personal computer. The apparatus of the present invention includes a portable (i.e., 2.5") hard computer disk drive, and a housing is positioned in the cavity for releasably holding the disk drive. The housing includes electrical contacts that are in electrical communication with the personal computer.

As intended by the present invention, the drive is movable in the housing between an engaged position, wherein the drive is electrically connected to the contacts, and an ejection position, wherein the drive can be manually removed from the housing. An ejector mechanism is operably engaged with the housing for ejecting the disk drive.

In yet another aspect of the present invention, a method for transferring data from a personal computer (PC) to a hard disk drive is disclosed. The method of the present invention includes the steps of providing an opening in the PC and manually advancing the hard disk drive into the opening until electrical contact is made between the hard disk drive and the PC. Then, data is transferred between the hard disk drive and the PC, and the hard disk drive is ejected from the PC.

In still another aspect of the present invention, a computer system includes a desk-top personal computer (PC) which has an electronic component and a cavity. A housing is positioned in the cavity, and the housing has an opening and at least one electrical contact in electrical communication with the electronic component of the PC. Also, a hard computer disk drive that has an electronic data storage medium is movable between an engaged position, wherein the data storage medium is in electrical communication with the electrical contacts of the housing, and an ejection position, wherein the hard drive can be manually removed from the housing. An ejector mechanism is operably engaged with the housing for holding the hard disk drive in the engaged position and selectively moving the disk drive to the ejection position.

The details of the present invention, both as to its construction and operation, can best be understood in reference to the accompanying drawings, in which like reference numerals refer to like parts, and in which:

BRIEF DESCRIPTION OF THE DRAWINGS

FIG. 4A is an exploded perspective view of the portable hard disk drive, sleeve, and front portion of the disk drive housing of the present invention;

DETAILED DESCRIPTION OF THE PREFERRED EMBODIMENT

Figure 1:
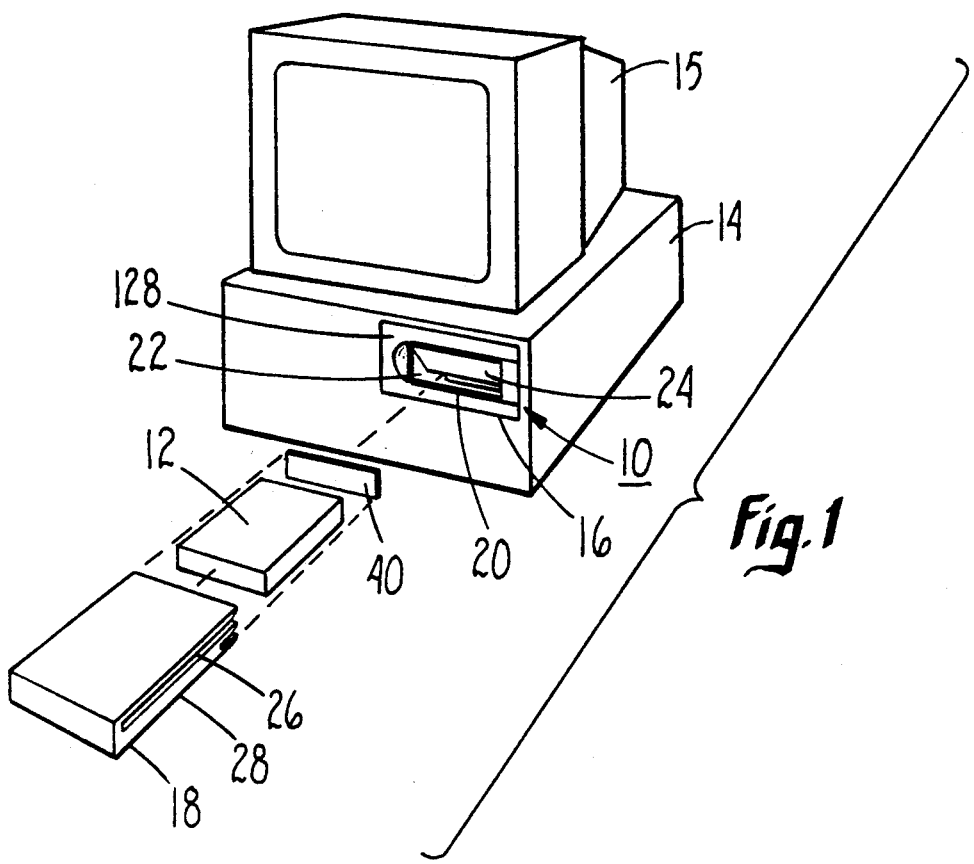
FIG. 1 is a perspective view of the portable hard disk drive housing of the present invention in one intended environment, with the portable hard disk drive in an exploded relationship with its sleeve.
Figure 2:
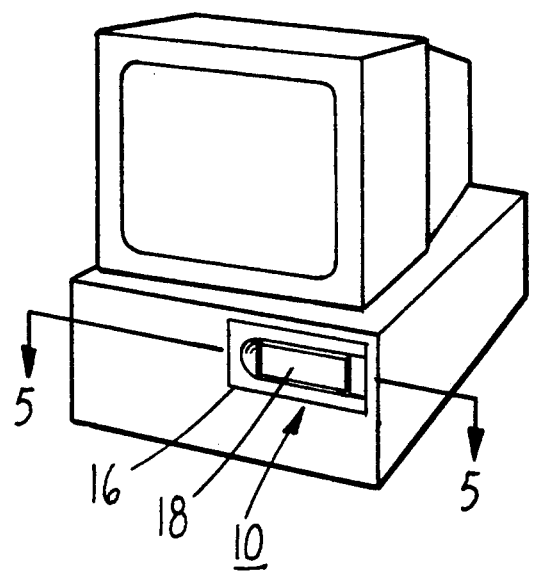
FIG. 2 is a perspective view of the portable hard disk drive housing of the present invention in one intended environment, with the portable hard disk drive in operable engagement with the housing.

Referring initially to FIGS. 1 and 2, an apparatus, generally designated 10, is shown for holding a portable hard disk drive 12 in operable engagement with a desk-top personal computer (PC) 14 having an associated video monitor 15. As shown in FIGS. 1 and 2 and more fully discussed below, the apparatus 10 fits snugly within a standard-sized disk drive cavity 16 of the desk-top personal computer 14.

In the presently preferred embodiment, the desk-top personal computer 14 is a device familiarly referred to as an International Business Machines (IBM ®) compatible desk-top PC, e.g., an IBM ® PS2 model 70 computer. Accordingly, in the preferred embodiment the cavity 16 is the so-called "3.5 inch form factor" cavity (actually four inches in width) formed in most IBM ® compatible desk-top personal computers. It is to be understood, however, that the principles of the present invention can be applied to non-IBM ® compatible computers, e.g., Apple ® brand computers.

As intended by the present invention, the hard disk drive 12 is portable, i.e., the hard disk drive 12 is relatively small and light-weight. In the presently preferred embodiment, the hard disk drive 12 is a model 2022A hard disk drive made by Digital Electronics Corporation. As shown in FIG. 1 and more fully disclosed below, the hard disk drive 12 is disposed in a sleeve 18 to protect and cushion the hard disk drive 12.

FIG. 1 shows that the apparatus 10 includes a housing 20 having an opening 22. The opening 22 is covered by a movable flap 24, the top edge of which is hingedly connected to the housing 20. For illustration purposes, the flap 24 is shown partially blocking the opening 22, but as more fully disclosed below, the flap 24 is normally biased to completely block the opening 22.

As can be appreciated in reference to FIG. 2, the portable hard disk drive 12 with sleeve 18 can be manually advanced into the opening 22 of the housing 20 and held in operable engagement with the personal computer 14. When the portable hard disk drive 12 is operably engaged with the housing 20, data can be stored on the hard disk drive 12 by the user of the computer 14. Then, the portable hard disk drive 12 can be ejected from the computer 14 and transported to another location for data retrieval.

Figure 3:
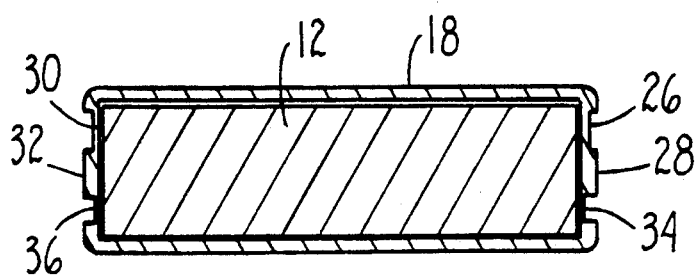
FIG. 3 is a cross-sectional view of the portable hard disk drive and sleeve.

FIGS. 1 and 3 show that the sleeve 18 closely surrounds the portable hard disk drive 12 for supporting the disk drive 12. Preferably, the sleeve 18 is made of nylon or other plastic material to protect the disk drive 12 from shock, and to inhibit dust and debris from contacting the disk drive 12.

As shown in cross-reference to FIGS. 1 and 3, a parallelepiped-shaped right guide channel 26 is longitudinally formed in a right side surface 28 of the sleeve 18. Also, FIG. 3 shows that a parallelepiped-shaped left guide channel 30 is longitudinally formed in a left side surface 32 of the sleeve 18. Further, right and left latch grooves 34, 36 are also formed in respective right and left side surfaces 28, 32 of the sleeve 18. Referring briefly to FIG. 4A, the end of the right guide channel 26 which is nearest to an open insertion end 38 of the sleeve 18 is flared outwardly from the axis of the guide channel 26, for purposes to be shortly disclosed. It is to be understood that the left guide channel 30 is in all essential respects identical to the right guide channel 26. As can be appreciated in reference to FIGS. 1 and 4A, the portable hard disk drive 12 can be advanced through the open insertion end 38 and into the sleeve 18.

FIGS. 1 and 4 also show that an electrical connector 40 is attached to the sleeve 18 to cover the open insertion end 38 once the disk drive 12 has been disposed in the sleeve 18. Preferably, the electrical connector 40 is attached to the sleeve 18 by screws (not shown). It is to be understood that the electrical connector 40 is in electrical communication with the memory medium inside the disk drive 12, i.e., the connector 40 mating engages the electrical connection components (not shown) of the disk drive 12. It is to be further understood that the electrical connector 40 includes suitable contacts (not shown), e.g., pin contacts, which protrude outwardly from the sleeve 18 for engaging a complementary component within the housing 20.

Figure 4B:
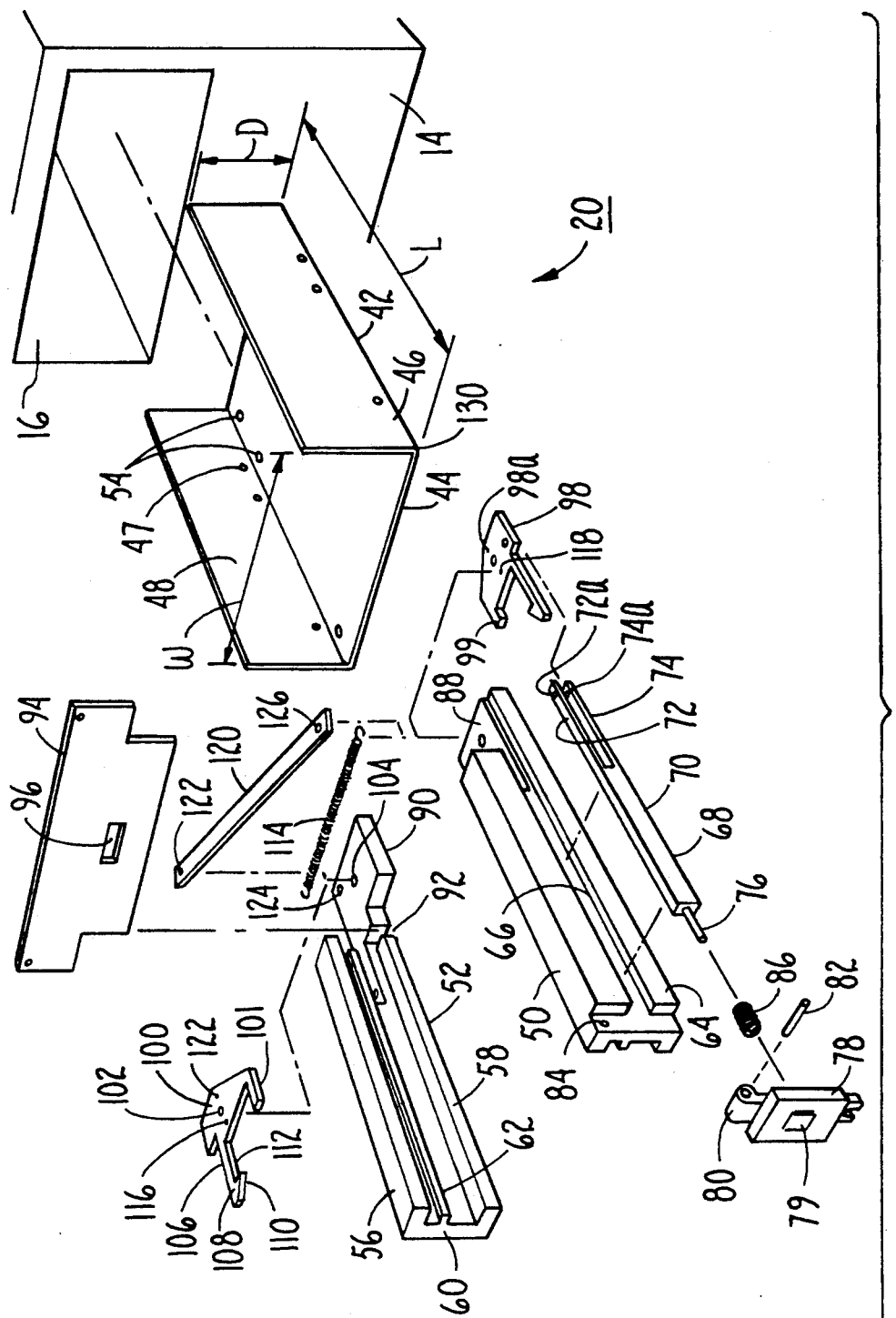
FIG. 4B is an exploded perspective view of the portable hard disk drive housing of the present invention.

Now referring to FIGS. 4A and 4B, the details of the housing 20 can be seen. As shown in FIG. 4B, the housing 20 includes a hollow, generally parallelepiped-shaped metal or hard plastic chassis 42. The chassis 42 has a bottom surface 44, and two side surfaces 46, 48 extending upwardly from the bottom surface 44 perpendicular to the bottom surface 44. As shown, each side surface 46, 48 of the chassis 42 has three holes 47 drilled or otherwise formed in it, for receiving respective threaded fasteners (not shown). The fasteners in turn are engaged with standard mounting receptacles (not shown) within the computer 14, to hold the chassis 42 within the cavity 16 of the computer 14.

Accordingly, the chassis 42 is configured for fitting snugly within the cavity 16 of the computer 14. Specifically, the chassis 42 has a length "L" of about six inches (6"), a width "W" of about four inches (4"), and a depth "D" of about one and five-eighths inches (1.625").

FIG. 4B also shows that the housing 20 includes a key element for guiding the sleeve 18 with disk drive 12 into operable engagement with the housing 20. In the preferred embodiment, the key element is established by right and left guide rails 50, 52 which are connected to the chassis 42. In this preferred embodiment, the guide rails 50, 52 are connected to the chassis 42 by threaded fasteners (not shown), each of which extends through one of the rails 50, 52 and into one of the holes 54 formed in the bottom surface 44 of the chassis 42. Preferably, each guide rail 50, 52 is made of metal or hard plastic, e.g., polycarbonate.

Taking the left guide rail 52 as an example, FIG. 4B best shows that the left guide rail 52 has a top flange 56, a bottom flange 58 which is fastened to the chassis 42, and a rail wall 60 between the top flange 56 and bottom flange 58. Also, a parallelepiped-shaped guide shaft 62 extends longitudinally along the rail wall 60. This guide shaft 62 has a shape that is complementary to the left guide channel 30 of the sleeve 18, so that the guide shaft 62 fits snugly within the left guide channel 30 and can slidably engage the sleeve 18. It is to be understood that the right guide rail 50 can slidably engage the right guide channel 26 of the sleeve 18.

Still referring to FIG. 4B, the right guide rail 50 has a rail wall 64, and a push rod channel 66 is formed in the rail wall 64 of the right guide rail 50. An elongated push rod 68, the function of which will shortly be disclosed, is slidably disposed in the push rod channel 66. As shown, the push rod 68 has a shank 70 that has a rectangular cross-section for slidably engaging the push rod channel 66. The shank 70 includes two opposed arms 72, 74 that are spaced from each other, and each arm 72, 74 has a respective hole 72a, 74a. Also, the push rod 68 has a cylindrical shaft 76 which is longitudinally distanced from the arms 72, 74 of the shank.

FIG. 4B further shows that a rectangular end cap 78 is hingedly connected to the right guide rail 50 and is juxtaposed with the push rod 68. More specifically, the end cap 78 includes a hollow hinge 80, and a dowel pin 82 extends through the hinge 80 into a hole 84 formed in the right guide rail 50. The dowel pin 82 is rotatably engaged with the hole 84, so that the end cap 78 is pivotally engaged with the right guide rail 50. Additionally, a push spring 86 is positioned in a surrounding relationship with the shaft 76 of the push rod 68, and the spring 86 is in compression to urge the end cap 78 away from the push rod 68. If desired, an electrical activity lamp 79 can be mounted on the end cap 78.

Continuing with the description of FIG. 4B, each guide rail 50, 52 has a respective right and left extension mount 88, 90 connected to or formed integrally with the respective rail wall 64, 60. A left slot 92 is established between the left extension mount 90 and the bottom flange 58 of the left guide rail 52, and a right slot (not shown in FIG. 4B) is established between the right extension mount 88 and the bottom flange of the right guide rail 50.

An electrical circuit board 94 is positioned with a portion of the circuit board 94 disposed in the left and right slots 92. It is to be understood that the electrical circuit board 94 is in electrical contact with the computer 14. It is to be further understood that the electrical circuit board 94 includes contacts 96 (shown schematically in FIG. 4B) for electrically engaging the outwardly-protruding contacts of the electrical connector 40 (FIG. 4A) when the disk drive 12 is operably engaged with the housing 20, to thereby establish a pathway for electrical current flow between the hard disk drive 12 and the computer 14. Moreover, the electrical circuit board 94 can include electronic components which are electrically connected to the electrical activity lamp 79 on the end cap 78 for selectively energizing the electrical activity lamp 79, when the disk drive 12 is operably engaged with the housing 20.

Proceeding with the description of FIG. 4B, a metal right latch 98 is rotatably engaged with the right extension mount 88, and a metal left latch 100 is rotatably engaged with the left extension mount 90. More specifically, taking the left latch 100 as an example, a dowel pin (not shown) extends through a hole 102 in the left latch 100 and a hole 104 in the left extension mount 90, to rotatably couple the left latch 100 with the left extension mount 90. The right latch 98 is likewise rotatably coupled to the right extension mount 88.

FIG. 4B shows that the left latch 100 includes a latch arm 106 which extends toward the opening 22 of the housing 20. The latch arm 106, as shown, is configured for ratchetably engaging the latch arm 106 has a latch head 108, and the latch head 8 has a ramped surface 110 for "riding" against the sleeve 18 to permit the sleeve 18 to be advanced toward the circuit board 94. Also, the latch head 108 has an abutting surface 112 for preventing movement of the sleeve 94 away from the circuit board 94 once the latch head 108 is engaged with the latch groove 36. Similarly, the right latch 98 ratchetably engages the right latch groove 34 of the sleeve 18. Moreover, the latches 98, 100 are formed with respective pushers 99, 101 which protrude toward the opening 22 of the housing 20.

To urge the latch arms of the latches 98, 100 toward each other, a latch spring 114 is connected in tension to both latches 98, 100. More particularly, one end of the latch spring 114 protrudes through a hole 116 in the left latch 100, while the other end of the latch spring 114 protrudes through a hole 118 in the right latch 98. The ends of the spring 114 can be tack welded to the latches 98, 100 to hold the spring 114 onto the latches 98, 100.

Additionally, to couple the right latch 98 with the left latch 100, such that one degree of rotation of one latch will cause a corresponding degree of rotation of the other latch, an elongated rigid metal link 120 is connected to both latches 98, 100. More specifically, a first link dowel pin (not shown) extends through a hole 122 in the link 120 and into a hole 124 in the left latch 100. Also, a second link dowel pin (not shown) extends through a hole 126 in the link 120 and into the hole 118 in the right latch 98. Together, the latches 98, 100, latch spring 114, and link 120 establish a latch mechanism. Also, the latch mechanism, along with the push rod 68 and end cap 78, establish an ejector mechanism.

Recall that the push rod 68 extends through the push rod channel 66 of the right guide rail 50. It may now be appreciated that the push rod 68 is connected to the right latch 98 to provide a means to move the right latch 98. Specifically, the right latch 98 is sandwiched between the arms 72, 74 of the push rod 68, and a dowel pin (not shown) extends through the holes 72a, 74a in the arms 72, 74, and the dowel pin also extends through a hole 98a formed or drilled in the right latch 98. Accordingly, reciprocal motion of the push rod 68 causes counterclockwise rotational motion of the right latch 98. Recall further that the link 120 couples the latches 98, 100. Consequently, reciprocal motion of the push rod 68 causes clockwise rotational motion of the left latch 100.

Referring back to FIG. 4A, a plastic bezel 128 is snap fitted onto the front edge 130 of the chassis 42 (FIG. 4B) by means well-known in the art to cover a portion of the opening 22 of the housing 20. Also, FIG. 4A shows that the flap 24 has a hinge 132 through which a dowel pin (not shown) can extend. This dowel pin is rotatably connected to the chassis 42. A stop 134 can abut the front bezel 130 to prevent the flap 24 from moving beyond the front bezel 130, and a spring (not shown) is connected to the flap 24 and chassis 42 by means well-known in the art to urge the stop 134 of the flap 24 against the front bezel 130 to block the opening 22 of the housing 20.

Figure 5A:
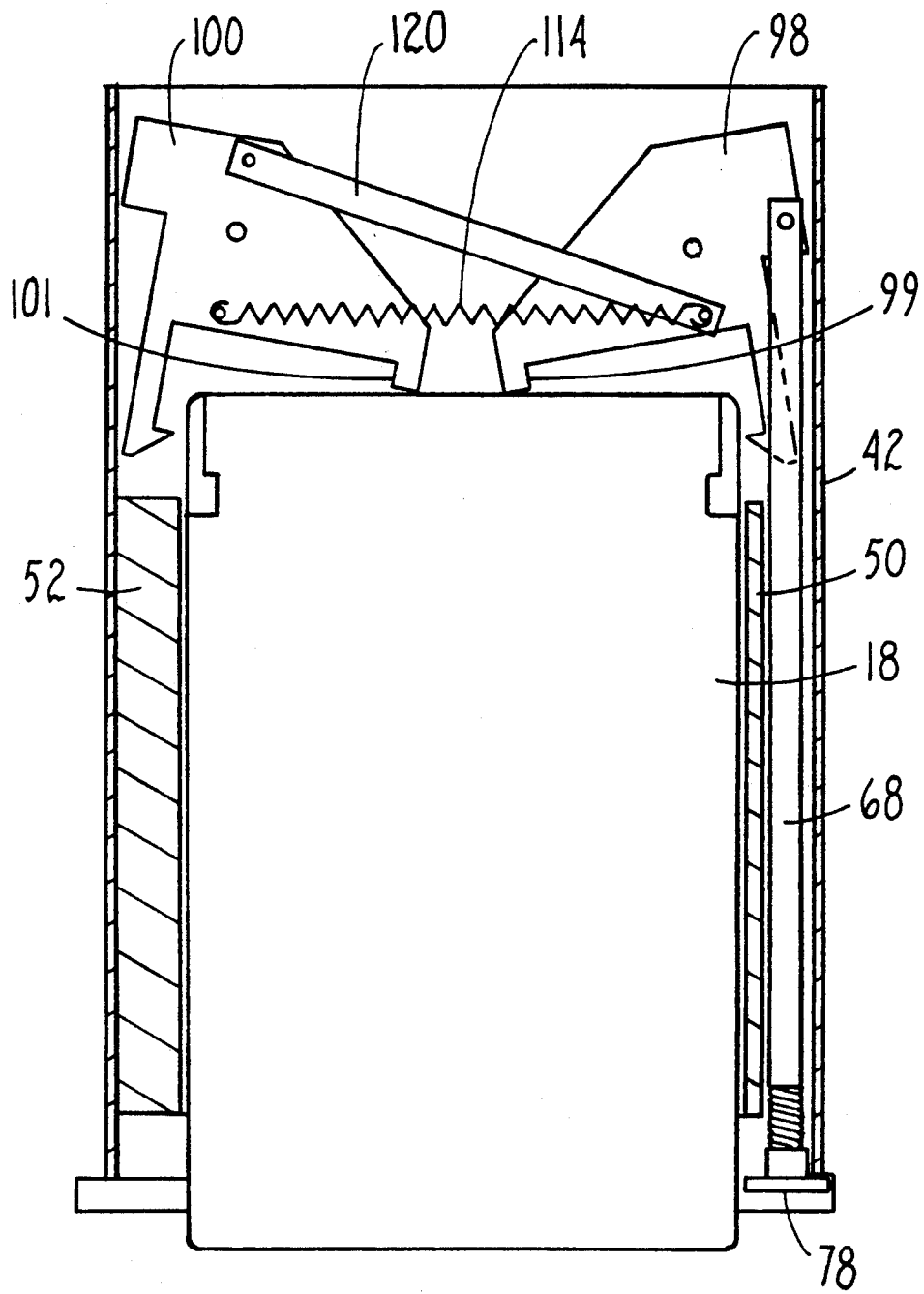
FIG. 5A is a cross-sectional view of the portable hard disk drive housing of the present invention, with the latch mechanism shown in the unlatched configuration, as would be seen along the line 5—5 in FIG. 2.
Figure 5B:
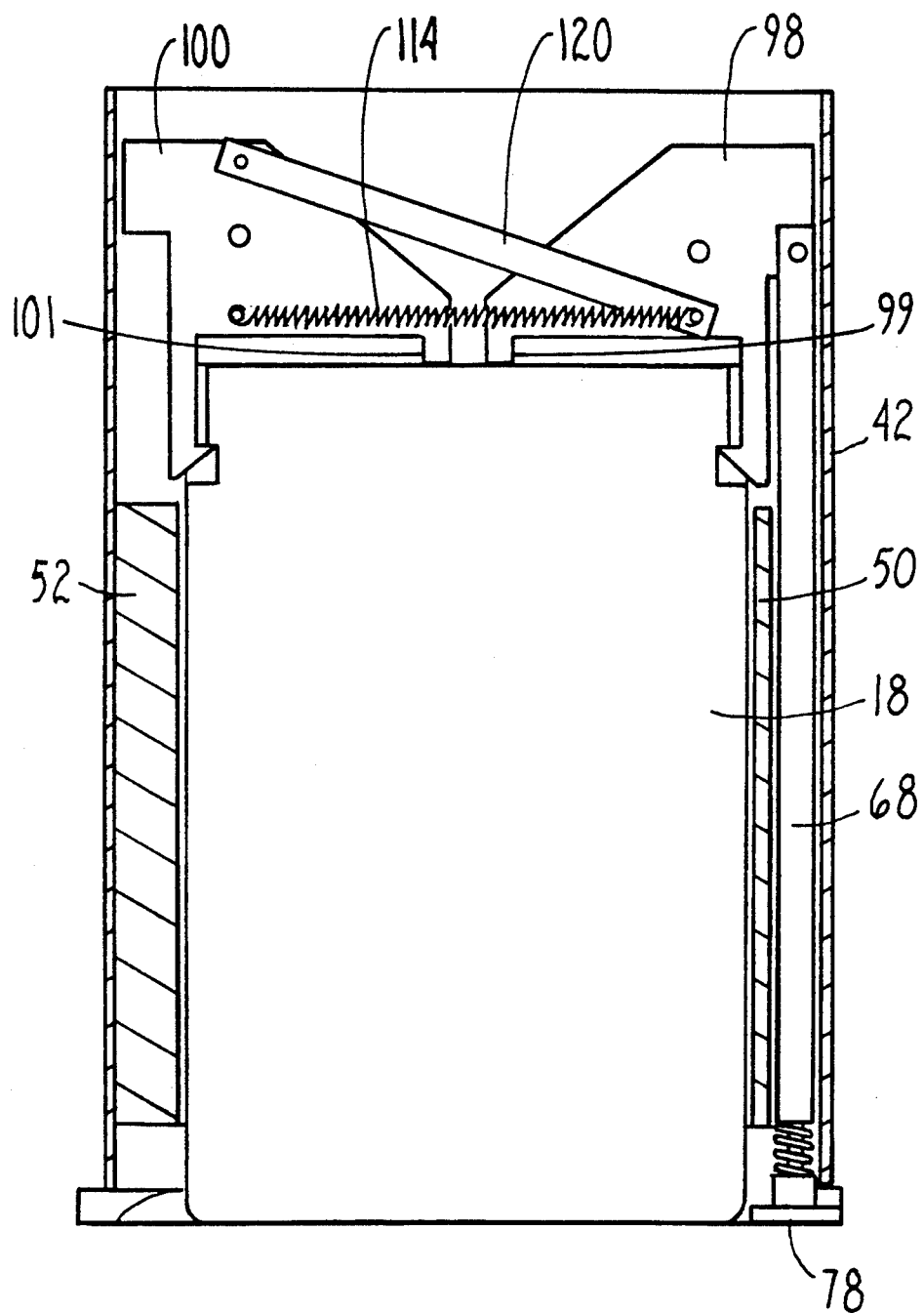
FIG. 5B is a cross-sectional view of the portable hard disk drive housing of the present invention, with the latch mechanism shown in the latched configuration, as seen along the line 5—5 in FIG. 2.

The operation of the apparatus 10 can best be understood in cross-reference to FIGS. 1, 5A, and 5B. The sleeve 18 with portable hard disk drive 12 and connector 40 is advanced, connector 40 first, against the flap 24 to urge the flap 24 inwardly into the housing 20. As the sleeve 18 is advanced into the housing 20, the guide channels 26, 30 of the sleeve 18 slidably engage the guide shafts (guide shaft 62 shown in FIG. 4A) of the guide rails 50, 52, by means previously disclosed, and the sleeve 18 is thereby guided along a precise predetermined pathway into the housing 20.

As the sleeve 18 is advanced into the housing 20, the latch heads 108 of the latches 98, 100, which, it will be recalled, are biased into the latched configuration shown in FIG. 5B by the latch spring 114, ride against the sleeve 18. Once the latch grooves 34, 36 (FIG. 1) are adjacent the latch heads of the latches 98, 100, however, the force of the spring 114 causes the latch heads to engage the latch grooves 34, 36. When the latch heads are so engaged, the sleeve 18 with disk drive 12 is held in an engaged position, wherein the disk drive 12 is electrically connected to the personal computer 14 through the connector 40 and contacts 96 (not shown in FIGS. 5A and 5B). Electronic components on the circuit board 94 shown in FIG. 4B periodically energize the activity lamp 79, to indicate that data transfer is occurring between the disk drive 12 and the computer 14.

When it is desired to remove the sleeve 18 with disk drive 12 from the housing 20, the user manually depresses the end cap 78 to cause the push rod 68 to reciprocate. In turn, this causes the latches 98, 100 to rotate to the unlatched configuration shown in FIG. 5A. In the unlatched configuration, the latch arms of the latches disengage the latch grooves 34, 36 of the sleeve, and the pushers 99, 101 of the latches 98, 100 urge the sleeve 18 with disk drive 12 back through the opening 22 of the housing 20. Thereby, the sleeve 18 with disk drive 12 is moved to an ejection position, wherein the sleeve 18 with disk drive 12 can be manually removed from the housing 20. When the end cap 78 is released, the latch spring 114 biases the latches 98, 100 back to the latched configuration shown in FIG. 5B.

While the particular housing for portable hard disk drive as herein shown and described in detail is fully capable of achieving the above-stated objects, it is to be understood that it is merely exemplary, and that the present invention fully contemplates other particular embodiments, and that the scope of the present invention is to be limited by nothing other than the appended claims.

What is claimed is:

1. An apparatus operably engageable with a disk drive cavity of a desk-top personal computer comprising:
   a hard computer disk drive;
   a housing positionable in the cavity of the computer for releasably receiving the disk drive, the housing including an opening for receiving the disk drive, the disk drive being movable in the housing between an engaged position, wherein the disk drive is electrically connected to the personal computer, and an ejection position, wherein the disk drive can be manually removed from the housing, the housing including electrical contacts for electrical connection with the personal computer generally opposite the opening of the housing;
   an ejector mechanism operably associated with the housing, the ejector mechanism including a latch mechanism movable from a latched configuration, wherein the disk drive is held in the engaged position, and an unlatched configuration, wherein the disk drive is moved to the ejection position;
   a hollow sleeve associated with the disk drive; and
   left and right guide rails disposed in the housing and opposed to each other, each guide rail extending from near the opening of the housing to near the electrical contacts of the housing, each guide rail being slidably engageable with the sleeve for guiding the hard disk drive into electrical contact with the electrical contacts of the housing,
   wherein the latch mechanism is movably connected to at least one of the guide rails, and wherein the sleeve is formed with a guide channel for engaging at least one of the guide rails and a latch groove for engaging the latch mechanism.

2. The apparatus of claim 1, wherein the latch mechanism is biased to the latched configuration, and the apparatus further comprises a push rod slidably engaged with one of the guide rails and connected to the latch mechanism for moving the latch mechanism to the unlatched configuration.

3. The apparatus of claim 2, wherein the latch mechanism includes a right latch rotatably connected to the right rail and a left latch rotatably connected to the left rail, each latch having a latch arm extending toward the opening of the housing, each latch arm being ratchetably engageable with the hard disk drive sleeve.

4. The apparatus of claim 3, further comprising a spring connected to both latches for biasing the latch mechanism to the latched configuration.

5. An apparatus for releasably holding a hard computer disk drive having an electronic memory medium, comprising:
   a parallelepiped-shaped housing configured for permitting the housing to be mounted in a disk drive cavity of a desk-top personal computer, the housing having an opening for receiving the hard computer disk drive therein, the housing including a plurality of electrical contacts for engaging electrical contacts in the personal computer to establish a pathway for electrical communication between the personal computer and the memory medium in the hard disk drive;
   at least one guide rail disposed in the housing and extending from near the opening of the housing into the housing for guiding the hard disk drive into the housing;
   an ejector mechanism operably engaged with the housing for selectively holding the hard disk drive within the housing and for releasing the hard disk drive to thereby permit the disk drive to be manually removed from the housing, wherein the ejector mechanism includes a latch mechanism movably connected to the guide rail; and
   a sleeve positionable in a surrounding relationship to the disk drive, wherein the sleeve is formed with a guide channel for engaging the guide rail and a latch groove for engaging the latch mechanism.

6. The apparatus of claim 5, wherein the latch mechanism has a latched configuration, wherein the latch mechanism engages the sleeve to hold the disk drive against the electrical contacts of the housing, and an unlatched configuration, wherein the disk drive with sleeve can be manually inserted into and removed from the housing.

7. The apparatus of claim 6, wherein the latch mechanism is biased to the latched configuration, and the apparatus further comprises left and right guide rails and a push rod slidably engaged with one of the guide rails and connected to the latch mechanism for moving the latch mechanism to the unlatched configuration.

8. The apparatus of claim 7, wherein the latch mechanism includes a right latch rotatably connected to the right rail and a left latch rotatably connected to the left rail, each latch having a latch arm extending toward the opening of the housing, each latch arm being ratchetably engageable with the hard disk drive sleeve.

9. The apparatus of claim 8, further comprising a spring connected to both latches for biasing the latch mechanism to the latched configuration.

10. A method for transferring data from a desk-top personal computer (PC) to a hard disk drive, comprising the steps of:
   (a) providing a cavity in the desk-top PC;
   (b) providing
      (1) a housing defining an opening and comprising a plurality of electrical contacts,
      (2) left and right guide rails,
      (3) an ejector mechanism including a latch mechanism movably connected to at least one of the guide rails, and
      (4) a sleeve formed with a guide channel for engaging at least one of the guide rails and a latch groove for engaging the latch mechanism;
   (c) installing the housing in the cavity of the PC with the contacts positioned in electrical communication with the PC;
   (d) disposing the left and right guide rails in the housing, each guide rail extending from near the opening of the housing into the housing;
   (e) engaging the ejector mechanism with the housing for selectively holding the hard disk drive within the housing and for releasing the hard disk drive;
   (f) positioning the sleeve in a surrounding relationship to the disk drive;

(g) manually advancing the sleeve with hard disk drive into the opening of the housing until electrical contact is made between the hard disk drive and the PC;

(h) transferring data between the hard disk drive and the PC; and (i) manually ejecting the hard disk drive from the PC.

11. The method of claim 10, further comprising the steps of:

(j) advancing another hard disk drive into the opening; and (k) transferring data between the hard disk drive and the PC.

12. A computer system, comprising:

a desk-top personal computer (PC) having an electronic component and a cavity;

a housing positioned in the cavity, the housing having an opening and a plurality of electrical contacts in electrical communication with the electronic component;

a hard computer disk drive having an electronic data storage medium;

a hollow sleeve for holding the disk drive;

left and right guide rails disposed in the housing opposite each other and extending inwardly from the opening of the housing, each guide rail being slidably engageable with the sleeve;

a latch mechanism movably connected to at least one of the guide rails, wherein the sleeve is formed with a guide channel for engaging at least one guide rail and a latch groove for engaging the latch mechanism, wherein the latch mechanism holds the sleeve with disk drive in an engaged position, wherein the data storage medium is in electrical communication with the electronic component of the computer, and selectively moves the sleeve with disk drive toward an ejection position, wherein the hard disk drive can be manually removed from the housing.

13. The computer system of claim 12, wherein the latch mechanism is biased to the latched configuration, and the ejector mechanism further comprises a push rod slidably engaged with one of the guide rails and connected to the latch mechanism for moving the latch mechanism to the unlatched configuration.

14. The computer system of claim 13, wherein the latch mechanism includes a right latch rotatably connected to the right rail and a left latch rotatably connected to the left rail, each latch having a latch arm extending toward the opening of the housing, each latch arm being ratchetably engageable with the hard disk drive sleeve.

15. The computer system of claim 14, further comprising a spring connected to both latches for biasing the latch mechanism to the latched configuration.

* * * * *

UNITED STATES PATENT AND TRADEMARK OFFICE
CERTIFICATE OF CORRECTION

PATENT NO. : 5,319,519
DATED : June 7, 1994
INVENTOR(S) : Daniel C. Sheppard et al It is certified that error appears in the above-indentified patent and that said Letters Patent is hereby corrected as shown below:

On the Title Page, item [54] and column 1, line 3:

--HOUSING WITH LATCH AND EJECTION MECHANISM FOR PORTABLE HARD DISK DRIVE--.

Signed and Sealed this

Thirteenth Day of September, 1994

Attest:

BRUCE LEHMAN

*Attesting Officer*   *Commissioner of Patents and Trademarks*